(12) United States Patent
Kim et al.

(10) Patent No.: US 9,780,172 B2
(45) Date of Patent: Oct. 3, 2017

(54) METHOD OF REMOVING OXIDE FROM SUBSTRATE AND METHOD OF MANUFACTURING SEMICONDUCTOR DEVICE USING THE SAME

(71) Applicant: Industry-Academic Cooperation Foundation, Yonsei University, Seoul (KR)

(72) Inventors: Hyungjun Kim, Seoul (KR); Il-Kwon Oh, Seoul (KR)

(73) Assignee: Industry-Academic Cooperation Foundation, Yonsei University, Seoul (KR)

(*) Notice: Subject to any disclaimer, the term of this patent is extended or adjusted under 35 U.S.C. 154(b) by 82 days.

(21) Appl. No.: 14/590,319

(22) Filed: Jan. 6, 2015

(65) Prior Publication Data
US 2015/0194300 A1 Jul. 9, 2015

(30) Foreign Application Priority Data
Jan. 6, 2014 (KR) ........................ 10-2014-0001327

(51) Int. Cl.
*H01L 29/16* (2006.01)
*H01L 21/02* (2006.01)
*H01L 29/66* (2006.01)
*H01L 29/94* (2006.01)

(52) U.S. Cl.
CPC .......... *H01L 29/16* (2013.01); *H01L 21/0228* (2013.01); *H01L 21/02181* (2013.01); *H01L 21/02301* (2013.01); *H01L 21/02321* (2013.01); *H01L 21/02337* (2013.01); *H01L 21/02362* (2013.01); *H01L 29/66181* (2013.01); *H01L 29/94* (2013.01)

(58) Field of Classification Search
CPC ......... H01L 21/02043; H01L 29/66181; H01L 29/16; H01L 21/02301; H01L 29/94
See application file for complete search history.

(56) References Cited

U.S. PATENT DOCUMENTS

2011/0147795 A1* 6/2011 Rachmady ............ H01L 29/513
257/192
2013/0068390 A1 3/2013 Sanchez et al.

FOREIGN PATENT DOCUMENTS

| JP | 4216707 B2 | 11/2008 |
|---|---|---|
| JP | 2013-45961 A | 3/2013 |
| KR | 1020060054387 A | 5/2006 |
| KR | 1020060083373 A | 7/2006 |
| KR | 1020070035731 A | 4/2007 |

(Continued)

OTHER PUBLICATIONS

In-situ Surface-cleaning Process using TMA or Mg(Cp)2 for Ge Substrate, ICSE 2013, Busan, Korea, Nov. 21, 2013, School of Electrical and Electronic Engineering, Yonsei University, Seoul, Korea.

(Continued)

*Primary Examiner* — John P Dulka
(74) *Attorney, Agent, or Firm* — Procopio, Cory, Hargreaves & Savitch LLP

(57) ABSTRACT

Provided is a method of removing native oxide from a substrate, the method including exposing the substrate to trimethyl aluminum (TMA) or dicyclopentadienyl magnesium ($MgCp_2$) for a predetermined time.

20 Claims, 17 Drawing Sheets

(56) References Cited

FOREIGN PATENT DOCUMENTS

KR     1020100053282 A     5/2010
KR     1020130137774 A     12/2013

OTHER PUBLICATIONS

The 1st International Conference on Surface Engineering (ICSE2013), Nov. 18-Nov. 21,2013, Haeundae Grand Hotel, Busan, Korea.
2013 MRS Spring Meeting & Exhibit, Apr. 1-Apr. 5, 2013, San Francisco, California, Materials Research Society.
The Chemical and Electrical Properties of ALD HfO2 on Ge Substrate MOS Capacitor with TMA Self-cleaning Surface Treatment, MRS 2013, San Francisco, U.S.A., Apr. 3, 2013, School of Electrical and Electronic Engineering, Yonsei University, Seoul, Korea.

* cited by examiner

Fig. 10

| | Dielectric Constant | Interface Trap Density $D_{it}(cm^{-2}eV^{-1})$ | Hysteresis (mV) | Leakage Current Density -1MV/cm (A/cm$^2$) |
|---|---|---|---|---|
| HfO$_2$ | 17.3 | 4.77 x 10$^{13}$ | ~ 500 | 3.17 x 10$^{-6}$ |
| TMA 20 sec | 15.7 | 2.49 x 10$^{13}$ | ~ 100 | 1.56 x 10$^{-6}$ |
| TMA 120 sec | 12.9 | 9.39 x 10$^{12}$ | ~ 10 | 2.47 x 10$^{-7}$ |
| 1nm-Al$_2$O$_3$ IL | 11.8 | 1.03 x 10$^{13}$ | ~ 0 | 1.77 x 10$^{-7}$ |
| Mg(Cp)$_2$ 20 sec | 17.8 | 7.07 x 10$^{12}$ | ~ 80 | 6.99 x 10$^{-7}$ |
| Mg(Cp)$_2$ 120 sec | 17.5 | 1.98 x 10$^{12}$ | ~ 0 | 1.00 x 10$^{-7}$ |
| 1nm-MgO IL | 15.4 | 5.85 x 10$^{12}$ | ~ 10 | 3.04 x 10$^{-7}$ |

US 9,780,172 B2

METHOD OF REMOVING OXIDE FROM SUBSTRATE AND METHOD OF MANUFACTURING SEMICONDUCTOR DEVICE USING THE SAME

CROSS-REFERENCE TO RELATED APPLICATIONS

This U.S. non-provisional patent application claims priority under 35 U.S.C. §119 of Korean Patent Application No. 10-2014-0001327, filed on Jan. 6, 2014, the entire contents of which are hereby incorporated by reference.

BACKGROUND OF THE INVENTION

The present invention disclosed herein relates to a method of removing an oxide from a substrate and a method of manufacturing a semiconductor device using the same.

In semiconductor industries, integrated circuits have been improved in performance by simply reducing a size of a device to achieve a high response speed and low power consumption or by increasing the number of transistor to be integrated to one circuit. However, as the device decreases in size, non-negligible phenomena have been observed, which had never been seen in a large-scaled transistor. Particularly, when gate oxide has a thickness of about 4 nm or less, electron tunneling that leads to gate leakage current may occur. As a result, a gate dielectric has to have a thick thickness, however, if the gate dielectric has a thick thickness, it may be difficult to maintain sufficient capacitance for operating the device. Thus, high-k materials having high polarizability that allow the integrated circuit to have sufficient capacitance even when the gate dielectric has a thick thickness are alternately actively being studied.

Due to the limitation in the reducing of the size of the device, alternative methods for operating the integrated circuit at a high rate are being required. One of the methods is using a channel alternate material such as germanium. In this case, since the germanium has electron and hall mobility higher than those of the existing silicon, the substrate may be improved in performance.

However, the germanium has a native oxide very unstable thermally, unlike silicon oxide ($SiO_2$) very stable thermally, diffusion of the germanium to the oxide layer at a high temperature may not be prevented. Meanwhile, among germanium oxides, although GeO and $GeO_2$ are thermally unstable, $Ge_2O$ and $Ge_2O_3$ are thermally stable. A wet cleaning method has been used so as to remove the oxides. However, the wet cleaning method may not prevent a native oxide having a thickness of about 1 nm to about 2 nm from being formed again when next gate oxide is deposited, and thus deadly defects may occur in the device.

SUMMARY OF THE INVENTION

The present invention provides a method of removing native oxide from a germanium (Ge) substrate.

The present invention also provides a method of manufacturing a semiconductor device having a thin equivalent oxide thickness and high mobility.

The present invention also provides a method of manufacturing a thermally stable germanium (Ge) device.

The feature of the present invention is not limited to the aforesaid, but other features not described herein will be clearly understood by those skilled in the art from descriptions below.

Embodiments of the present invention provide methods of removing native oxide from a substrate, the methods including: exposing the substrate to trimethyl aluminum (TMA) or dicyclopentadienyl magnesium ($MgCp_2$) for a predetermined time.

In some embodiments, the methods may further include depositing gate oxide on the substrate, wherein the exposing the substrate to the TMA or the $MgCp_2$ is performed before depositing the gate oxide on the substrate.

In other embodiments, the substrate may include a germanium substrate.

In still other embodiments, the exposing the substrate to the TMA or the $MgCp_2$ may include exposing the substrate to the TMA to form an oxide layer including aluminum and germanium on the substrate, wherein, the oxide layer may be formed so that a ratio of the sum of binding energy areas of $Ge^{1+}$ and $Ge^{3+}$ to the sum of binding energy areas of $Ge^{2+}$ and $Ge^{4+}$ in a binding energy distribution of the oxide layer ranges from about 0.3 to about 1.

In even other embodiments, the exposing of the substrate to the TMA or the $MgCp_2$ may include exposing the substrate to the $MgCp_2$ to form an oxide layer including magnesium and germanium on the substrate, wherein, the oxide layer may be formed so that a ratio of the sum of binding energy areas of $Ge^{1+}$ and $Ge^{3+}$ to the sum of binding energy areas of $Ge^{2+}$ and $Ge^{4+}$ in a binding energy distribution of the oxide layer ranges from about 1 to about 5.

In yet other embodiments, the exposing the substrate to the TMA or the $MgCp_2$ may include reducing the native oxide including at least one selected from GeO and $GeO_2$ from the substrate.

In further embodiments, the exposing the substrate to the TMA or the $MgCp_2$ may be performed in a vacuum state.

In other embodiments of the present invention, methods of manufacturing a semiconductor device include: exposing a substrate to TMA or $MgCp_2$ for a predetermined time; and forming a gate insulation layer on the substrate.

In still other embodiments of the present invention, methods of manufacturing a germanium MOS capacitor include: exposing a germanium substrate to TMA or $MgCp_2$ for a predetermined time; and depositing a dielectric layer on the germanium substrate.

In even other embodiments of the present invention, semiconductor devices include: a substrate; an oxide layer on the substrate, the oxide layer including germanium and at least one selected from magnesium and aluminum; and an insulation layer on the oxide layer.

In some embodiments, the substrate may include a germanium substrate.

In other embodiments, the oxide layer may include magnesium and germanium, and a ratio of the sum of binding energy areas of $Ge^{1+}$ and $Ge^{3+}$ to a ratio of the sum of binding energy areas of $Ge^{2+}$ and $Ge^{4+}$ in a binding energy distribution of the oxide layer ranges from about 1 to about 5.

In still other embodiments, the oxide layer may include aluminum and germanium, and a ratio of the sum of binding energy areas of $Ge^{1+}$ and $Ge^{3+}$ to the sum of binding energy areas of $Ge^{2+}$ and $Ge^{4+}$ in a binding energy distribution of the oxide layer ranges from about 0.3 to about 1.

In even other embodiments, binding energy distribution of the oxide layer has peaks within a binding energy range of about 29.4 eV to about 29.6 eV and a binding energy range of about 30.9 eV to about 31.1 eV.

In yet other embodiments of the present invention, germanium MOS capacitors include: a germanium layer; an oxide layer on the germanium layer, the oxide layer including aluminum and germanium; a dielectric layer on the oxide layer; and an electrode on the dielectric layer.

In some embodiments, binding energy distribution of the oxide layer has peaks within a binding energy range of about 29.4 eV to about 29.6 eV and a binding energy range of about 30.9 eV to about 31.1 eV, and a ratio of the sum of binding energy areas of $Ge^{1+}$ and $Ge^{3+}$ to the sum of binding energy areas of $Ge^{2+}$ and $Ge^{4+}$ in a binding energy distribution of the oxide layer ranges from about 0.3 to about 1.

In further embodiments of the present invention, germanium MOS capacitors include: a germanium layer; an oxide layer on the germanium layer, the oxide layer including magnesium and germanium; a dielectric layer on the oxide layer; and an electrode on the dielectric layer.

In some embodiments, binding energy distribution of the oxide layer has peaks within a binding energy range of about 29.4 eV to about 29.6 eV and a binding energy range of about 30.9 eV to about 31.1 eV, and a ratio of the sum of binding energy areas of $Ge^{1+}$ and $Ge^{3+}$ to the sum of binding energy areas of $Ge^{2+}$ and $Ge^{4+}$ in a binding energy distribution of the oxide layer ranges from about 1 to about 5.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings:

FIGS. 6 to 10 are views illustrating results obtained by evaluating electrical characteristics of the germanium MOS capacitor according to an embodiment of the present invention;

DETAILED DESCRIPTION OF PREFERRED EMBODIMENTS

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

Unless otherwise defined, all terms (including technical and scientific terms) used herein have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

In the following description, the technical terms are used only for explain a specific exemplary embodiment while not limiting the present invention. The terms of a singular form may include plural forms unless referred to the contrary. The meaning of 'comprises' and/or 'comprising' specifies a composition, a component, a constituent, a stop, an operation and/or an element does not exclude other compositions, components, constituents, steps, operations and/or elements.

In the specification, 'and/or' means that it includes at least one of listed components.

The present invention relates to a method of removing a thermally unstable native oxide from the germanium substrate. According to an embodiment of the present invention, the substrate is exposed to a chemical substance in a vacuum state to effectively remove the native oxide from the germanium substrate before a gate oxide is deposited on the germanium substrate. Hereinafter, the method will be described with reference to the accompanying drawings in detail.

Figure 1:
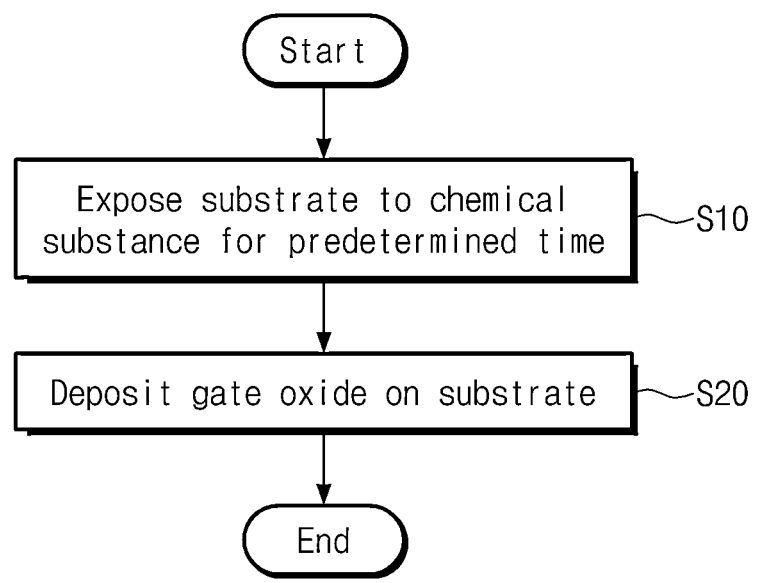
FIG. 1 is a view illustrating a method of removing native oxide on a substrate according to an embodiment of the present invention.

FIG. 1 is a view illustrating a method of removing native oxide on a substrate according to an embodiment of the present invention.

As illustrated in FIG. 1, the method of removing the native oxide according to an embodiment of the present invention may include a process (S10) for exposing a substrate to a chemical substance and a process (S20) for depositing gate oxide on the substrate.

According to an embodiment of the present invention, in the process (S10) for exposing the substrate to the chemical substance for a predetermined time, the chemical substance may be selected from chemical substances having good reactivity with respect to oxygen. In an embodiment, the chemical substance having the good reactivity with respect to oxygen may include magnesium or aluminum. In an embodiment, the chemical substance may be any one of trimethyl aluminum (TMA) or dicyclopentadienyl magnesium ($MgCp_2$).

According to an embodiment of the present invention, the substrate may be exposed to the TMA for about 10 seconds to about 130 seconds. Similarly, the substrate may be exposed to the MgCp$_2$ for about ten seconds to about 130 seconds. The substrate may be exposed to the TMA and the MgCp$_2$ in a vacuum state.

According to an embodiment of the present invention, the process (S10) for exposing the substrate to the chemical substance for a predetermined time may be performed on a germanium substrate.

According to an embodiment of the present invention, the process (S20) for depositing the gate oxide on the substrate may be performed by an atomic layer deposition (ALD) method. Alternatively, the gate oxide may be deposited on the substrate by other well-known deposition methods such as a chemical vapor deposition (CVD) method.

According to an embodiment of the present invention, the gate oxide deposited on the substrate includes a high-k material. For example, the gate oxide including the high-k material may be hafnium oxide (HfO$_2$). Hafnium oxide (HfO$_2$) may be deposited by the ALD method using a precursor source gas containing hafnium and oxygen plasma as reaction gases.

According to an embodiment of the present invention, the process (S10) for exposing the substrate to the chemical substance for a predetermined time may be performed before the process (S20) for depositing the gate oxide on the substrate. The chemical substance may be treated on the substrate before the gate oxide is deposited on the substrate to remove the native oxide in a vacuum state.

A method of removing the native oxide on the substrate according to an embodiment of the present invention may be applied to the method of manufacturing a semiconductor device that is manufactured by the ALD method. The above-described method of removing the native oxide from the substrate may be applied while ALD equipment is maintained in a vacuum state. Thus, the method of removing the native oxide from the substrate may be applied before the ALD is performed to manufacture a thermally stable semiconductor device without a great change in process.

Figure 2A:
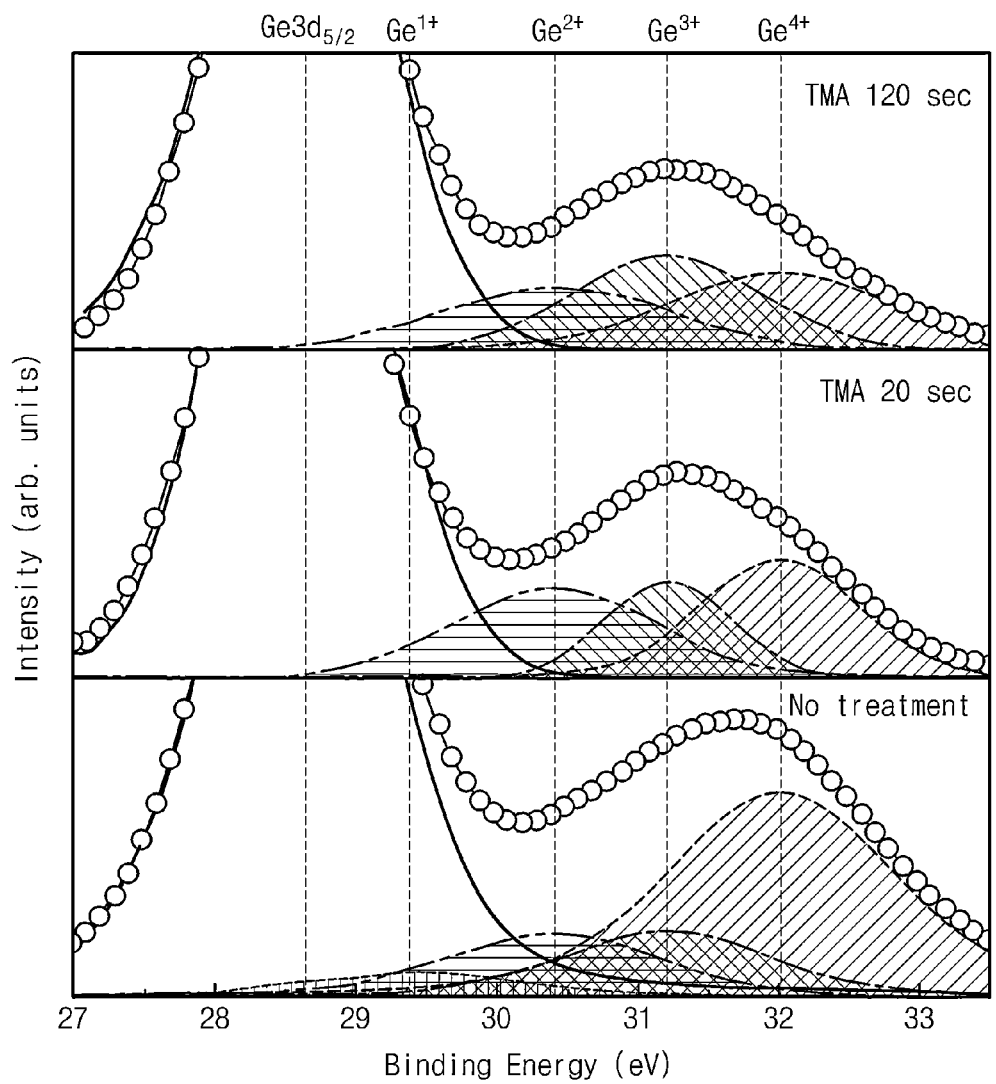
FIGS. 2A-2B and 3A-3B are views illustrating chemical compositions of the substrate to which the method of removing the native oxide is applied according to an embodiment of the present invention.
Figure 2B:
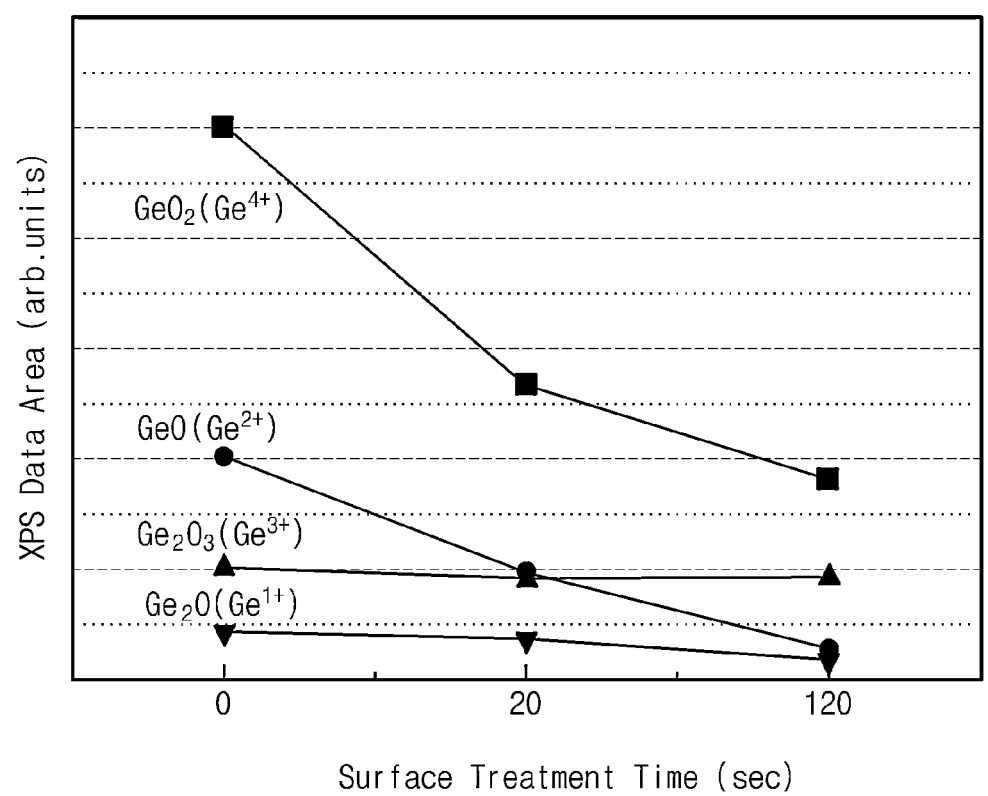
Figure 3A:
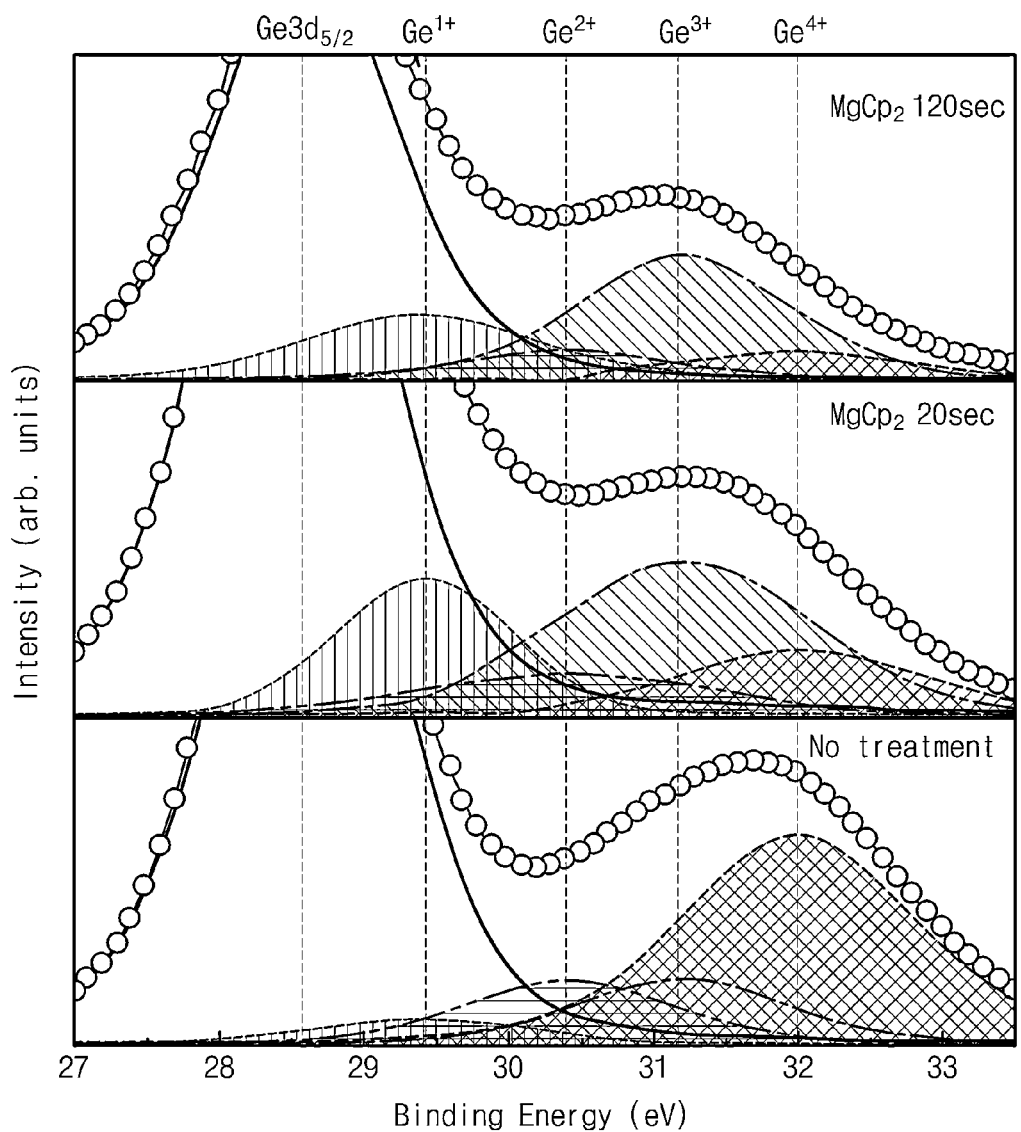

FIGS. 2 and 3 are views illustrating chemical compositions of the substrate to which the method of removing the native oxide is applied according to an embodiment of the present invention. FIG. 2 is a view illustrating results obtained by exposing the germanium (Ge) substrate to the TMA to deposit hafnium oxide on the germanium (Ge) substrate, and FIG. 3 is a view illustrating results obtained by exposing the germanium (Ge) substrate to the MgCp$_2$ to deposit hafnium oxide on the germanium (Ge) substrate. In order to analyze chemical compositions, binding energy of about 27 eV to about 34 eV with respect to germanium (Ge) was measured through energy of electrons in a 3$d$ orbital of the germanium by using X-ray photoelectron spectroscopy (XPS). In FIGS. 2A and 3A, vertically dotted lines represent peaks of Ge$_2$O (Ge$^{1+}$), GeO (Ge$^{2+}$), Ge$_2$O$_3$ (Ge$^{3+}$), GeO$_2$ (Ge$^{4+}$), and Ge, respectively. Here, data measured by the XPS and data in which the measured data are fitted are shown together.

Referring to FIG. 2A, results obtained by exposing the germanium (Ge) substrate to the TMA for about 120 seconds and about 20 seconds and by non-exposing the germanium (Ge) substrate to the TMA may be confirmed in order from above. It may be confirmed that all kinds of germanium (Ge) oxides, i.e., all of Ge$^{1+}$, Ge$^{2+}$, Ge$^{3+}$, and Ge$^{4+}$ are reduced in amount when the germanium (Ge) substrate is exposed to the TMA for about 20 seconds or about 120 seconds in comparison that the germanium substrate is not exposed to the TMA. Referring to FIGS. 2A and 2B, binding energy distribution areas of Ge$^{1+}$, Ge$^{2+}$, Ge$^{3+}$, and Ge$^{4+}$ may be confirmed. It may be confirmed that, as time taken for treating the substrate by using the TMA increases, the amount of each of Ge$^{1+}$, Ge$^{2+}$, Ge$^{3+}$, and Ge$^{4+}$ is reduced in comparison that the TMA treatment is not performed.

When the germanium (Ge) substrate 20 is exposed to the TMA, an oxide layer 50 may include aluminum and germanium oxide. In an exemplary embodiment, the substrate may be exposed to the TMA so that a ratio of the sum of the binding energy areas of Ge$^{1+}$ and Ge$^{3+}$ to the sum of the binding energy areas of Ge$^{2+}$ and Ge$^{4+}$ in a binding energy distribution of the oxide layer 50 ranges from about 0.3 to about 1. When the substrate is not exposed to the TMA, a ratio of the sum of the binding energy areas of Ge$^{1+}$ and Ge$^{3+}$ to the sum of the binding energy areas of Ge$^{2+}$ and Ge$^{4+}$ may be low, i.e., about 0.21. When the substrate is exposed to the TMA for about 20 seconds and about 120 seconds, a ratio of the sum of the binding energy areas of Ge$^{1+}$ and Ge$^{3+}$ to the sum of the binding energy areas of Ge$^{2+}$ and Ge$^{4+}$ may increase to about 0.35 and about 0.52, respectively.

The substrate may be exposed to the TMA so that the ratio of the sum of the binding energy areas of Ge$^{1+}$ and Ge$^{3+}$ to the sum of the binding energy areas of Ge$^{2+}$ and Ge$^{4+}$ ranges from about 0.3 to about 1, and thus the ratios of thermally unstable GeO (Ge$^{2+}$) and GeO$_2$ (Ge$^{4+}$) may decrease, and the ratios of relatively thermally stable Ge$_2$O (Ge$^{1+}$) and Ge$_2$O$_3$ (Ge$^{3+}$) may increase.

Referring to FIG. 3A, results obtained by exposing the germanium (Ge) substrate to the MgCp$_2$ for about 120 seconds and about 20 seconds and by non-exposing the germanium (Ge) substrate to the MgCp$_2$ may be confirmed in order form above. It may be confirmed that, when the substrate is exposed to the MgCp$_2$ for about 20 seconds or about 120 seconds, an amount of each of Ge$^{1+}$, Ge$^{2+}$, Ge$^{3+}$, and Ge$^{4+}$ is reduced, and the thermally unstable oxide is removed in comparison that the substrate is not exposed to the MgCp$_2$. According to the measurement using the XPS, it may be confirmed that the binding energy distribution of Ge$^{1+}$ has a peak within a binding energy range of about 29.4 eV to about 29.6 eV, and the binding energy distribution of Ge$^{3+}$ has a peak within a binding energy range of about 30.9 eV to about 31.1 eV.

Figure 3B:
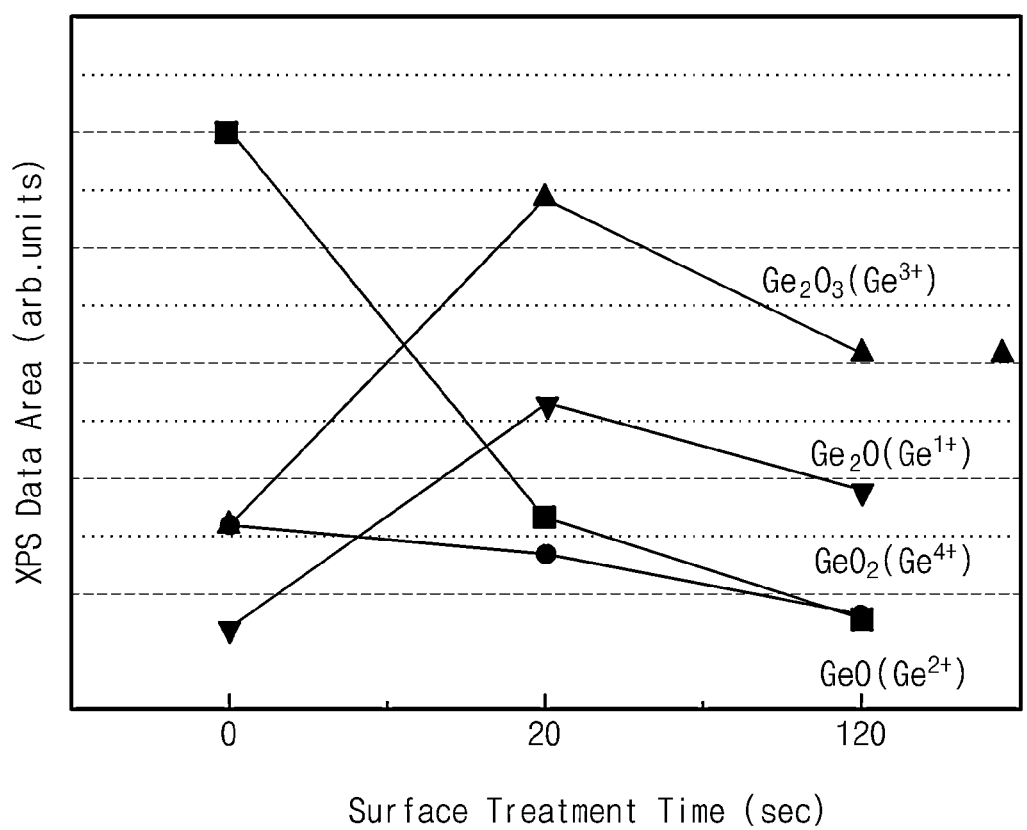

Referring to FIG. 3B, binding energy distribution areas of Ge$^{1+}$, Ge$^{2+}$, Ge$^{3+}$, and Ge$^{4+}$ according to the MgCp$_2$ treatment time may be confirmed. It may be confirmed that, when the MgCp$_2$ is treated on the substrate, Ge$^{2+}$ and Ge$^{4+}$ that are thermally unstable decrease in amount, and Ge$^{1+}$ and Ge$^{3+}$ that are relatively stable increase in amount in comparison that the MgCp$_2$ is not treated on the substrate. That is, it may be confirmed that when the MgCp$_2$ is treated on the substrate for about 20 seconds, thermally unstable Ge$^{2+}$ and Ge$^{4+}$ are changed into thermally stable Ge$^{1+}$ and Ge$^{3+}$. It may be confirmed that when the MgCp$_2$ is treated on the substrate for about 120 seconds, thermally unstable Ge$^{2+}$ and Ge$^{4+}$ more decrease in amount in comparison that the MgCp$_2$ is treated on the substrate for about 20 seconds. Here, the decreasing amounts of Ge$^{2+}$ and Ge$^{4+}$ are less than those of Ge$^{2+}$ and Ge$^{4+}$ obtained when the TMA is treated on the substrate for about 120 seconds. Unlike when the MgCp$_2$ is treated on the substrate for about 20 seconds, it may be confirmed that, when the MgCp$_2$ is treated on the substrate for about 120 seconds, the decreasing amount of Ge$^{2+}$ and Ge$^{4+}$ more decreases without changing from Ge$^{2+}$ and Ge$^{4+}$ into Ge$^{1+}$ and Ge$^{3+}$. Since each of Ge$^{1+}$ and Ge$^{3+}$ has a dielectric constant less than that of hafnium oxide, more superior electrical characteristics is obtained when the MgCp$_2$ is treated on the substrate for about 120 seconds in comparison that the MgCp$_2$ is treated on the substrate for about 20 seconds. When the MgCp$_2$ is treated on the substrate for about 120 seconds, thermally unstable Ge$^{2+}$ and Ge$^{4+}$ are significantly reduced in amount, and thus it may be confirmed that more thermally stable electrical characteristics is obtained in comparison that the MgCp$_2$ is treated on the substrate for about 20 seconds.

When the germanium (Ge) substrate 20 is exposed to the MgCp$_2$, the oxide layer 50 may include magnesium and germanium oxide. In an exemplary embodiment, the substrate may be exposed to the MgCp$_2$ so that a ratio of the sum of the binding energy areas of Ge$^{1+}$ and Ge$^{3+}$ to the sum of the binding energy areas of Ge$^{2+}$ and Ge$^{4+}$ in a binding energy distribution of the oxide layer ranges from about 1 to about 5. When the substrate is not exposed to the MgCp$_2$, a ratio of the sum of the binding energy areas of Ge$^{1+}$ and Ge$^{3+}$ to the sum of the binding energy areas of Ge$^{2+}$ and Ge$^{4+}$ may be low, i.e., about 0.35. When the substrate is exposed to the MgCp$_2$ for about 20 seconds and about 120 seconds, a ratio of the sum of the binding energy areas of Ge$^{1+}$ and Ge$^{3+}$ to the sum of the binding energy areas of Ge$^{2+}$ and Ge$^{4+}$ may increase to about 2.38 and about 3.23, respectively.

The substrate may be exposed to the MgCp$_2$ so that the ratio of the sum of the binding energy areas of Ge$^{1+}$ and Ge$^{3+}$ to the sum of the binding energy areas of Ge$^{2+}$ and Ge$^{4+}$ ranges from about 1 to about 5, and thus the ratios of thermally unstable GeO (Ge$^{2+}$) and GeO$_2$ (Ge$^{4+}$) may decrease, and the ratios of relatively thermally stable Ge$_2$O (Ge$^{1+}$) and Ge$_2$O$_3$ (Ge$^{3+}$) may increase.

Figure 4:
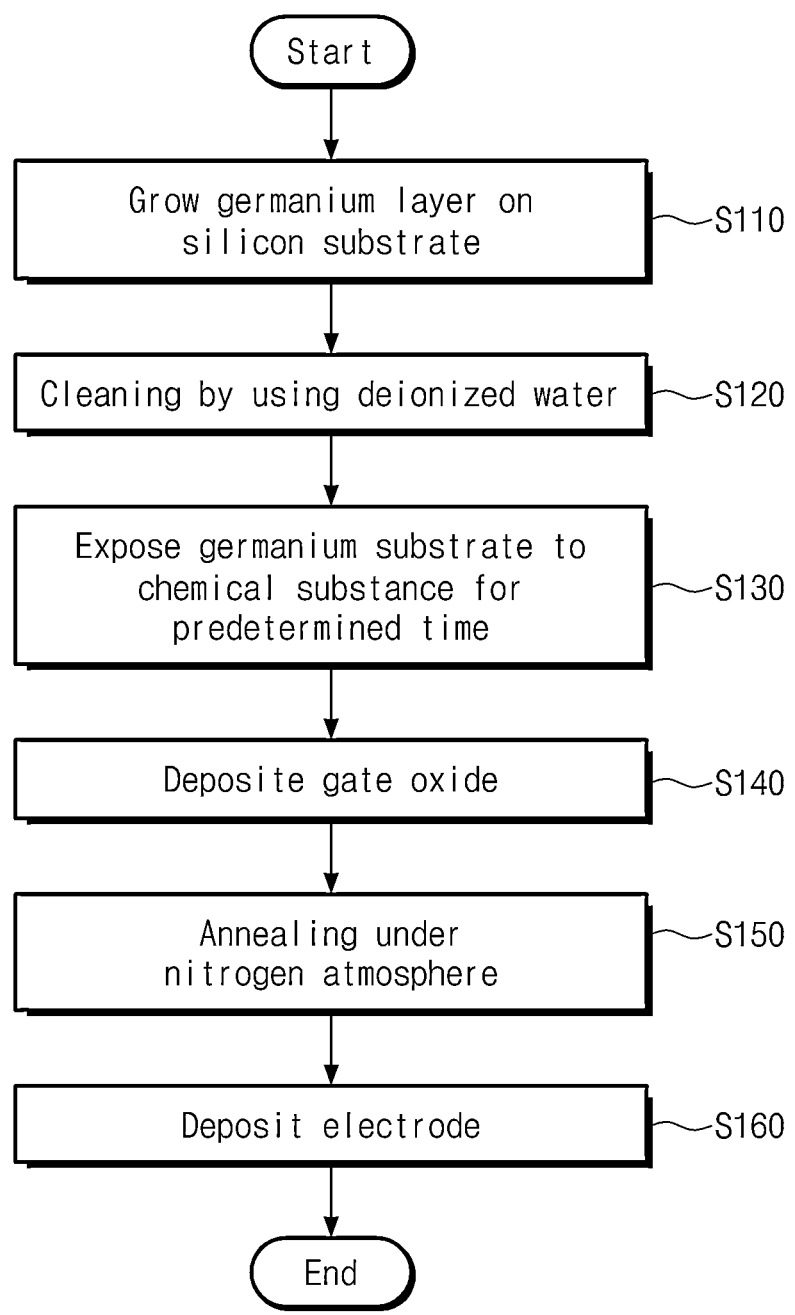
FIG. 4 is a view illustrating a method of manufacturing a germanium metal oxide semiconductor (MOS) capacitor according to an embodiment of the present invention.

FIG. 4 is a view illustrating a method of manufacturing a germanium metal oxide semiconductor (MOS) capacitor according to an embodiment of the present invention.

As shown in FIG. 4, the germanium MOS capacitor according to an embodiment of the present invention includes a process (S110) for growing a germanium substrate on a silicon substrate, a process (S120) for cleaning the substrate by using deionized water, a process (S130) for exposing the germanium substrate to chemical substance for a predetermined time, a process (S140) for depositing hafnium oxide by using the ALD, a process (S150) for annealing the substrate under a nitrogen atmosphere, and a process (S160) for depositing an electrode.

A germanium substrate grown on the silicon substrate is immersed into diluted hydrofluoric acid and then is cleaned by using the deionized water before the process (S130) for exposing the germanium substrate to the chemical substance for a predetermined time is performed. The germanium substrate may be immersed into the diluted hydrofluoric acid for about 30 seconds.

Then, the process (S130) for exposing the germanium substrate to the chemical substance for a predetermined time may be performed. In an embodiment, the process (S130) for exposing the germanium substrate to the chemical substance for a predetermined time may be performed within the ALD equipment. As explained in FIG. 1, the chemical substance may be any one of the TMA or the MgCp$_2$. The germanium substrate may be exposed to the TMA for about 10 seconds to about 130 seconds. Similarly, the substrate may be exposed to the MgCp$_2$ for about 10 seconds to about 130 seconds. The substrate may be exposed to the TMA and the MgCp$_2$ in a vacuum state.

The process (S140) for depositing gate oxide may be performed on the germanium substrate exposed to the chemical substance by using the ALD. Since the process (S130) for exposing the germanium substrate to the chemical substance for a predetermined time is performed within the ALD equipment, the gate oxide may be deposited on the substrate according to the existing process without big changes. In an embodiment, the gate oxide may be hafnium oxide.

The process (S150) for annealing the substrate under the nitrogen atmosphere may be performed at a temperature of about 400° C.

In the process (S160) for depositing the electrode, an aluminum metal electrode may be deposited on the substrate by using a sputter.

Figure 5A:
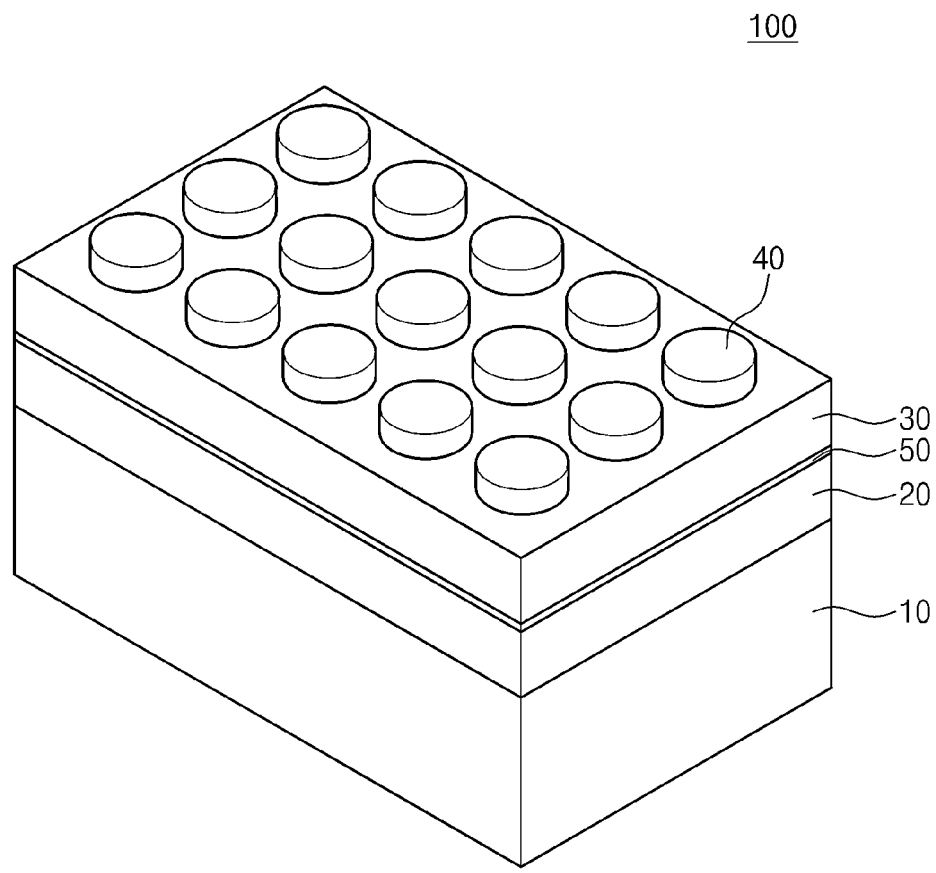
FIG. 5A is a view of the germanium MOS capacitor according to an embodiment of the present invention.

FIG. 5A is a view of the germanium MOS capacitor according to an embodiment of the present invention.

As illustrated in FIG. 5A, the germanium MOS capacitor 100 according to an embodiment of the present invention includes a silicon substrate 10, the germanium substrate 20, gate oxide 30, an aluminum electrode 40, and a germanium oxide layer 50.

The germanium MOS capacitor according to an embodiment of the present invention may be manufactured according to the method illustrated in FIG. 4. The germanium substrate 20 may be grown on the silicon substrate 10 through the process (S110) for growing the germanium substrate on the silicon substrate of FIG. 4.

In the process (S130) for exposing the germanium substrate to the chemical substance for a predetermined time of FIG. 4, the germanium substrate 20 may be exposed to the TMA or the MgCp$_2$ for a predetermined time to form the germanium oxide layer 50 on the germanium substrate 20. In an exemplary embodiment, in binding energy distributions of the oxide layer 50, the binding energy distribution of Ge1+ may have a peak within a binding energy range of about 29.4 eV to about 29.6 eV, and the binding energy distribution of Ge3+ may have a peak within a binding energy range of about 30.9 eV to about 31.1 eV.

When the germanium (Ge) substrate 20 is exposed to the TMA, the oxide layer 50 may include aluminum and germanium oxide. Here, in the binding energy distributions of the oxide layer 50, a ratio of the sum of the binding energy areas of Ge$^{1+}$ and Ge$^{3+}$ to the sum of the boding energy areas of Ge$^{2+}$ and Ge$^{4+}$ may range from about 0.3 to about 1. In the case in which the substrate is exposed to the TMA, when the ratio of the sum of the binding energy areas of Ge$^{1+}$ and Ge$^{3+}$ to the sum of the binding energy areas of Ge$^{2+}$ and Ge$^{4+}$ ranges from about 0.3 to about 1, the ratios of thermally unstable GeO (Ge$^{2+}$) and GeO$_2$ (Ge$^{4+}$) may decrease, and the ratios of relatively thermally stable Ge$_2$O (Ge$^{1+}$) and Ge$_2$O$_3$ (Ge$^{3+}$) may increase.

When the germanium (Ge) substrate 20 is exposed to the MgCp$_2$, the oxide layer 50 may include magnesium and germanium oxide. Here, in the binding energy distributions of the oxide layer 50, a ratio of the sum of binding energy areas of Ge$^{1+}$ and Ge$^{3+}$ to the sum of boding energy areas of Ge$^{2+}$ and Ge$^{4+}$ may range from about 1 to about 5. In the case in which the substrate is exposed to the MgCp$_2$, when the ratio of the sum of binding energy areas of Ge1+ and Ge$^{3+}$ to the sum of binding energy areas of Ge$^{2+}$ and Ge$^{4+}$ ranges from about 1 to about 5, a ratio of thermally unstable GeO (Ge$^{2+}$) and GeO$_2$ (Ge$^{4+}$) may be reduced, and ratios of relatively thermally stable Ge$_2$O (Ge$^{1+}$) and Ge$_2$O$_3$ (Ge$^{3+}$) may increase.

A dielectric layer 30 may be deposited on the germanium substrate 20 through the process for depositing the gate oxide by using the ALD (S140) of FIG. 4. The gate oxide may be deposited by using the high-k material. In an embodiment, the gate oxide may be hafnium oxide.

The electrode 40 may be deposited on the dielectric layer 30 through the process (S160) for depositing the electrode of FIG. 4. In an embodiment, the electrode may be the aluminum metal electrode. The electrically characteristics of the germanium MOS capacitor according to an embodiment of the present invention will be described with reference to FIGS. 6 to 10.

Figure 5B:
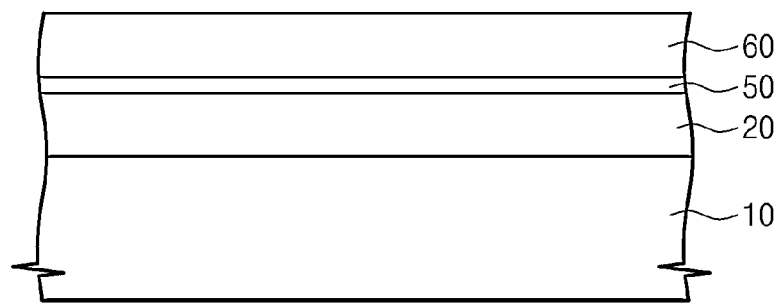
FIG. 5B is a view of a semiconductor device according to an embodiment of the present invention.

FIG. 5B is a view of a semiconductor device according to an embodiment of the present invention. Referring to FIG. 5B, the semiconductor device includes substrates 10 and 20, the oxide layer 50 on the substrates 10 and 20, and an insulation layer 60 on the oxide layer 50. Each of the substrates 10 and 20 may be provided with the germanium substrate. The oxide layer 50 includes germanium and at least one selected from magnesium and aluminum.

Each of the substrates 10 and 20 may be provided with the germanium substrate in which the germanium substrate 20 is grown on the silicon substrate 10. The germanium layer 20 may be exposed to the TMA or the MgCp$_2$ for a predetermined time to form the oxide layer 50 on the germanium layer 20.

In binding energy distributions of the oxide layer 50, the binding energy distribution of Ge$^{1+}$ may have a peak within a binding energy range of about 29.4 eV to about 29.6 eV, and the binding energy distribution of Ge$^{3+}$ may have a peak within a binding energy range of about 30.9 eV to about 31.1 eV.

When the germanium (Ge) substrates 10 and 20 are exposed to the TMA, the oxide layer 50 may include aluminum and germanium oxide. Here, in the binding energy distributions of the oxide layer 50, a ratio of the sum of the binding energy areas of Ge$^{1+}$ and Ge$^{3+}$ to the sum of the boding energy areas of Ge$^{2+}$ and Ge$^{4+}$ may range from about 0.3 to about 1.

In the case in which the substrate is exposed to the TMA, when the ratio of the sum of the binding energy areas of Ge$^{1+}$ and Ge$^{3+}$ to the sum of the binding energy areas of Ge$^{2+}$ and Ge$^{4+}$ ranges from about 0.3 to about 1, the ratios of thermally unstable GeO (Ge$^{2+}$) and GeO$_2$ (Ge$^{4+}$) may decrease, and the ratios of relatively thermally stable Ge$_2$O (Ge$^{1+}$) and Ge$_2$O$_3$ (Ge$^{3+}$) may increase.

When the germanium (Ge) substrate 20 is exposed to the MgCp$_2$, the oxide layer 50 may include magnesium and germanium oxide. Here, in the binding energy distributions of the oxide layer 50, a ratio of the sum of binding energy areas of Ge$^{1+}$ and Ge$^{3+}$ to the sum of boding energy areas of Ge$^{2+}$ and Ge$^{4+}$ may range from about 1 to about 5. In the case in which the substrate is exposed to the MgCp$_2$, when the ratio of the sum of binding energy areas of Ge$^{1+}$ and Ge$^{3+}$ to the sum of binding energy areas of Ge$^{2+}$ and Ge$^{4+}$ ranges from about 1 to about 5, a ratio of thermally unstable GeO (Ge$^{2+}$) and GeO$_2$ (Ge$^{4+}$) may be reduced, and ratios of relatively thermally stable Ge$_2$O (Ge$^{1+}$) and Ge$_2$O$_3$ (Ge$^{3+}$) may increase.

The gate oxide may be deposited on the germanium substrates 10 and 20 having the oxide layer 50 to form the insulation layer 60. The gate oxide may be deposited by using the high-k material. In an embodiment, the gate oxide may be hafnium oxide.

Figure 6:
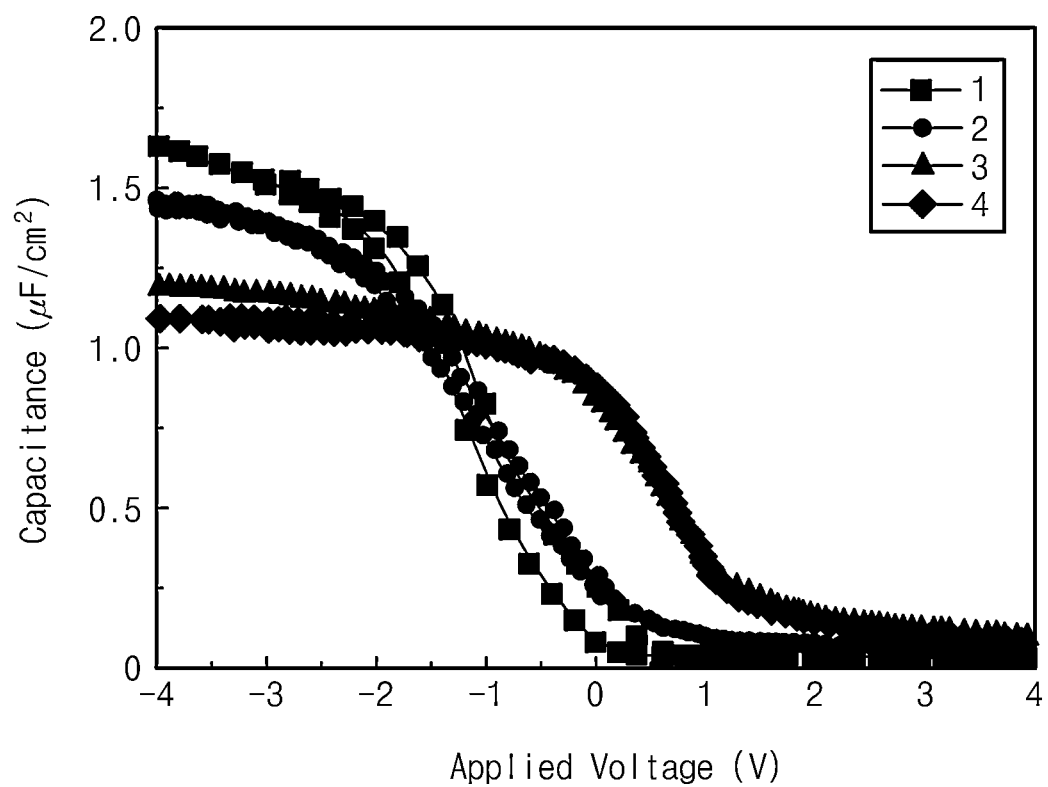
Figure 7:
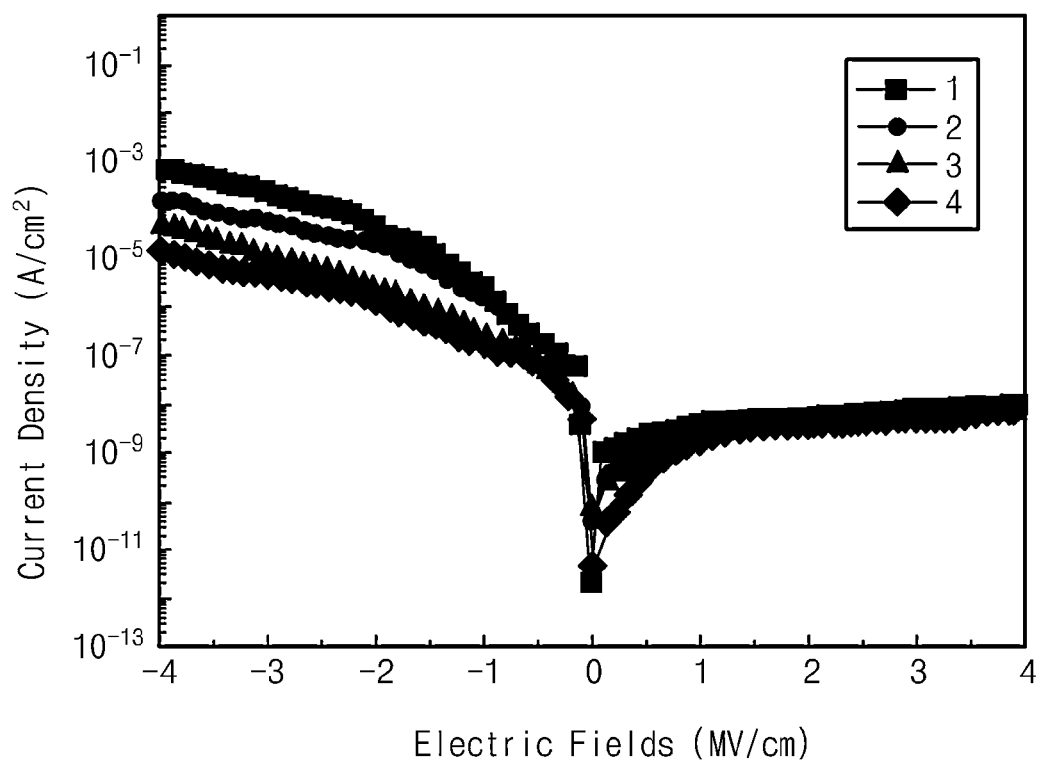
Figure 8:
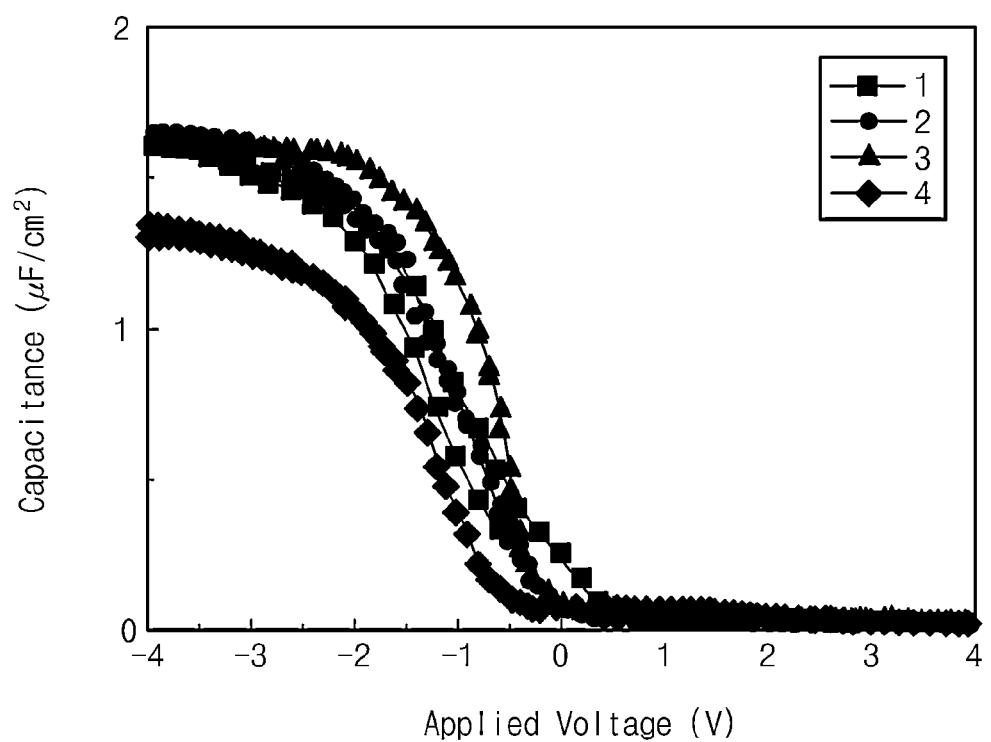
Figure 9:
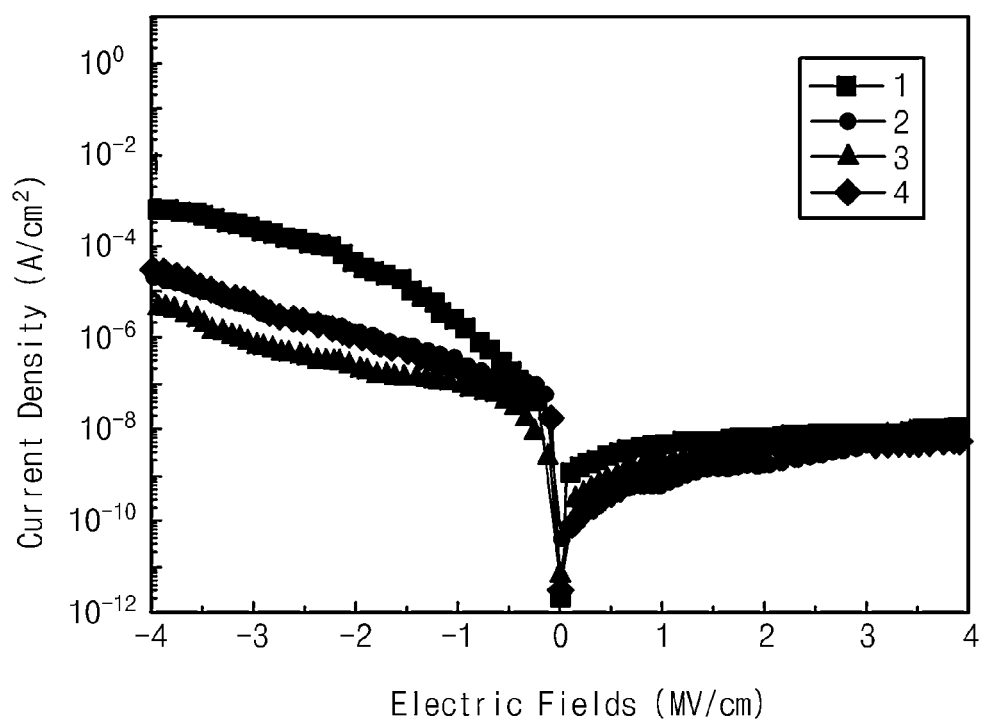

FIGS. 6 to 10 are views illustrating results obtained by evaluating electrical characteristics of the germanium MOS capacitor according to an embodiment of the present invention. FIGS. 6 and 7 are views illustrating the electrical characteristics of the germanium MOS capacitor that is manufactured by exposing the germanium substrate to the TMA for a predetermined time, and FIGS. 8 and 9 are views illustrating the electrical characteristics of the germanium MOS capacitor that is manufactured by exposing the germanium substrate to the MgCp$_2$ for a predetermined time.

FIG. 6 is a view illustrating a relationship between an applied voltage and a capacitance, and FIG. 7 is a view illustrating a relationship between electric fields and a current density. In FIGS. 6 and 7, graph 1 represents the germanium MOS capacitor on which the TMA is not treated, graph 2 represents the germanium MOS capacitor on which the TMA is treated for about 20 seconds, and graph 3 represents the germanium MOS capacitor on which the TMA is treated for about 120 seconds. Also, for comparison, a case in which aluminum oxide (Al$_2$O$_3$) layer having a thickness of about 1 nm is added on the germanium MOS capacitor is shown in graph 4.

Referring to FIG. 6, although the dielectric constant gradually decreases due to the aluminum oxide (Al$_2$O$_3$) as the time taken for the TMA treatment increases, it may be seen that a flatband voltage (VFB) moves in a positive direction.

Referring to FIG. 7, the hafnium oxide is diffused into the germanium substrate during the annealing process at a temperature of about 400°. Here, as the time taken for the TMA treatment increases, it may be seen that leakage current gradually decreases due to the removal of the germanium oxide.

FIG. 8 is a view illustrating a relationship between an applied voltage and a capacitance, and FIG. 9 is a view illustrating a relationship between electric fields and current density. In FIGS. 8 and 9, graph 1 represents the germanium MOS capacitor on which the MgCp$_2$ is not treated, graph 2 represents the germanium MOS capacitor on which the MgCp$_2$ is treated for about 20 seconds, and graph 3 represents the germanium MOS capacitor on which the MgCp$_2$ is treated for about 120 seconds. Also, for comparison, a case in which magnesium oxide (MgO) layer having a thickness of about 1 nm is added on the germanium MOS capacitor is shown in graph 4.

In FIG. 8, when comparing the results obtained by treating the MgCp$_2$ is treated on the substrate for about 20 seconds to the results obtained by depositing the magnesium oxide (MgO) on the substrate, it may be confirmed that, when the MgCp$_2$ is treated on the substrate, a capacitance is larger than that of the substrate on which the magnesium oxide (MgO) is deposited. Also, it may be confirmed that, when the MgCp$_2$ is treated on the substrate for about 20 seconds, a capacitance is not significantly reduced in comparison that the MgCp$_2$ is not treated on the substrate. Unlike the capacitance that is significantly reduced when the TMA is treated on the substrate for about 120 seconds, it may be confirmed that a capacitance is not reduced when the MgCp$_2$ is treated on the substrate for about 120 seconds.

Referring to FIG. 9, it may be confirmed that leakage current is reduced when the MgCp$_2$ is treated on the substrate for about 20 second in comparison that the MgCp$_2$ is not treated to the substrate. It may be confirmed that leakage current is more reduced when the MgCp$_2$ is treated on the substrate for about 120 seconds in comparison that the MgCp$_2$ is treated to the substrate for about 20 seconds. The MgCp$_2$ treatment may be performed to remove the thermally unstable native oxide. Thus, the leakage current may be reduced due to the thermally stable oxide.

FIG. 10 is a view illustrating electrical characteristics of the germanium MOS capacitor according to an embodiment of the present invention.

As shown in FIG. 10, it may be confirmed that, when the TMA or the MgCp$_2$ is treated on the substrate, the substrate has a low interface trap density in comparison that hafnium oxide is deposited on the germanium substrate without any treatment. In particular, it may be seen that, when the MgCp$_2$ is treated on the substrate, relatively small leakage current is obtained without losing the dielectric constant.

FIG. 11 is an image obtained by analyzing a thin film, on which trimethyl aluminum (TMA) and dicyclopentadienyl magnesium (MgCp$_2$) are treated for about 120 seconds, by using transmission electron microscopy (TEM). FIG. 11A is an image showing the case the TMA is treated, and FIG. 11B is an image showing that the case the MgCp$_2$ is treated. When the MgCp$_2$ is treated, it may be confirmed that a relatively thick germanium oxide layer is formed on the substrate in comparison that the TMA is treated. This is done because, as illustrated in FIGS. 2 and 3, the TMA removes the entire germanium oxide layer, but the MgCp$_2$ changes the unstable germanium oxide layer into the thermally stable germanium oxide layer.

Figure 11A:
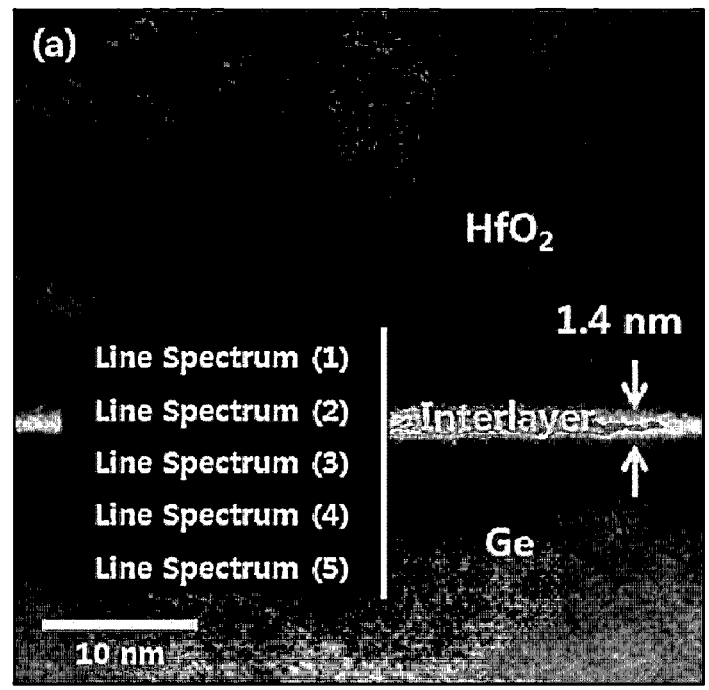
FIGS. 11A-11B are images obtained by analyzing a thin film, on which trimethyl aluminum (TMA) and dicyclopentadienyl magnesium ($MgCp_2$) are treated for about 120 seconds, by using transmission electron microscopy (TEM)
Figure 11B:
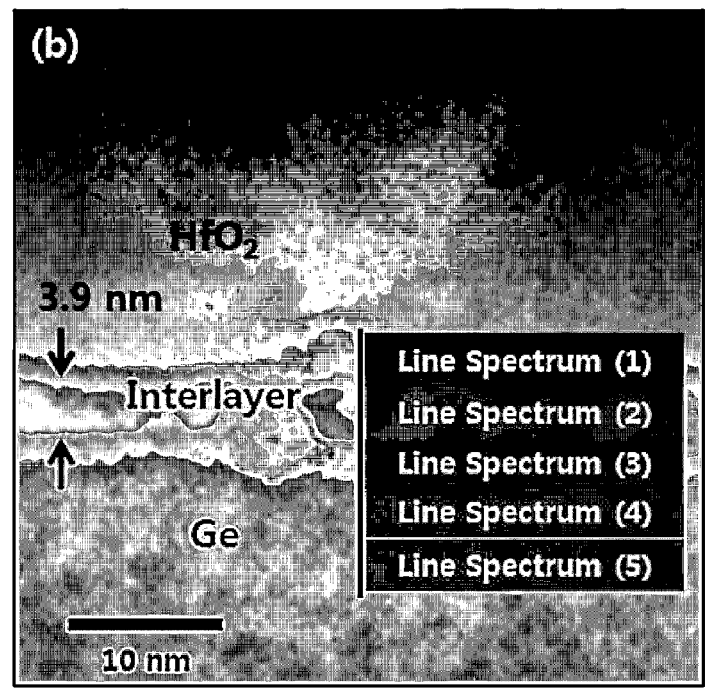
Figure 11C:
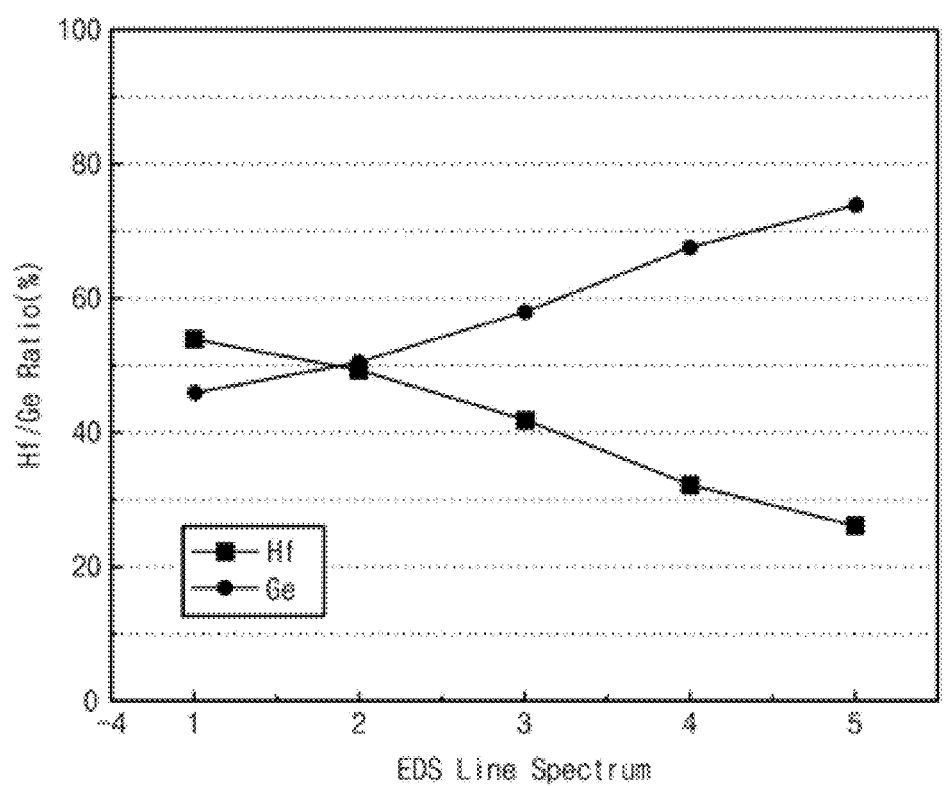
FIGS. 11C and 11D are graphs showing values obtained with respect to element content in the image obtained through the TEM by using energy dispersive spectroscopy (EDS)
Figure 11D:
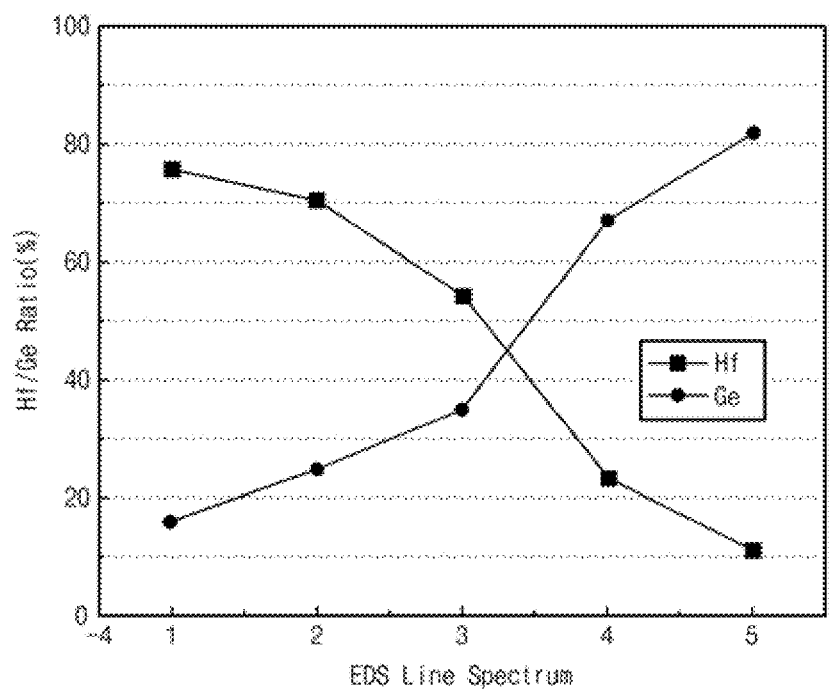

FIGS. 11C and 11D are graphs showing values obtained with respect to element content in the image obtained through the TEM by using energy dispersive spectroscopy (EDS). In the EDS, when the TMA is treated on the substrate, aluminum (Al) was detected from the germanium oxide layer, and when the MgCp$_2$ is treated on the substrate, magnesium (Mg) was detected from the germanium oxide layer. When comparing a degree in which the germanium is diffused into a hafnium oxide thin film, the germanium is significantly less diffused when the MgCp$_2$ is used in comparison that the TMA is used. This is considered that the germanium is diffused into the hafnium oxide layer during the annealing process because the TMA does not leave any germanium oxide layer on an interface. On the other hand, since the MgCp$_2$ leaves the thermally stable oxide layer on the interface, the MgCp$_2$ may prevent the germanium from being diffused into the hafnium oxide layer during the annealing process.

Figure 12A:
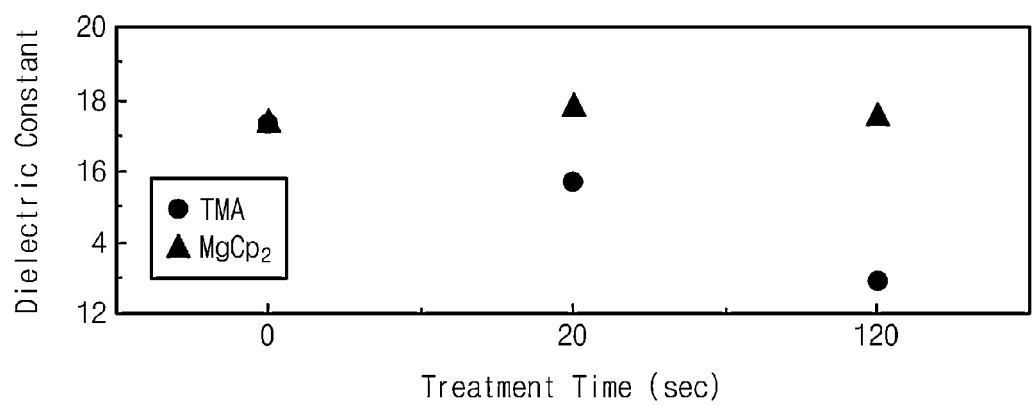
FIG. 12A is a graph showing a variation in dielectric constant according to removal of the native oxide from the substrate.

FIG. 12A is a graph showing a variation in dielectric constant according to removal of the native oxide from the substrate. As shown in FIG. 12A, when the substrate is exposed to the MgCp$_2$, a relatively high dielectric constant may be obtained in comparison that the TMA is exposed to the substrate. Here, the semiconductor device may be improved in characteristic without reducing the dielectric constant.

Figure 12B:
FIG. 12B is a graph showing a variation in interface trap density according to the removal of the native oxide from the substrate.

FIG. 12B is a graph showing a variation in interface trap density according to the removal of the native oxide from the substrate. As shown in FIG. 12B, it may be seen that, when the substrate is exposed to the MgCp$_2$ or the TMA, an interface trap density may be reduced. In particular, when the substrate is exposed to the MgCp$_2$, a relatively low interface trap density may be obtained in comparison that the TMA is exposed to the substrate.

Figure 12C:
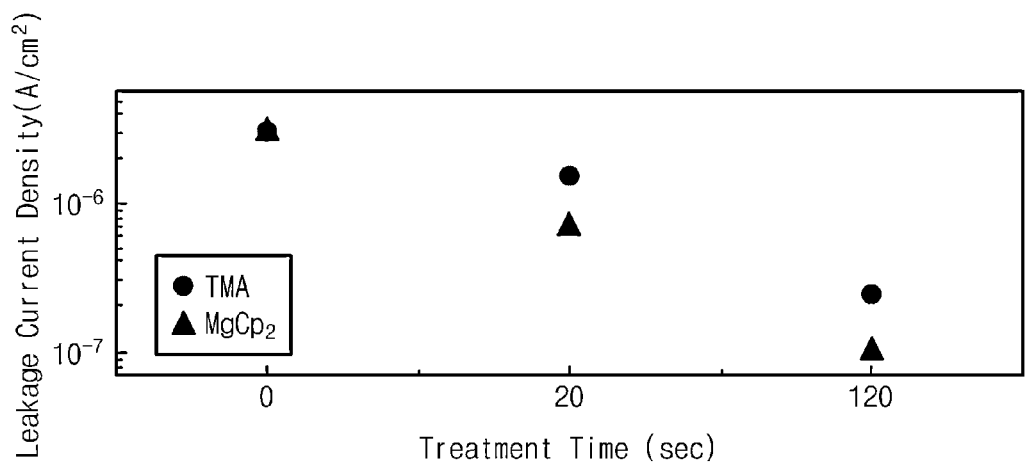
FIG. 12C is a graph showing a variation in leakage current density according to the removal of the native oxide from the substrate.

FIG. 12C is a graph showing a variation in leakage current density according to the removal of the native oxide from the substrate. A leakage current density was measured under an electric field condition of about 1 MV/cm. As shown in FIG. 12C, it may be seen that, when the substrate is exposed to the MgCp$_2$ or the TMA, a leakage current density may be reduced. In particular, when the substrate is exposed to the MgCp$_2$, a relatively low leakage current density may be obtained in comparison that the TMA is exposed to the substrate.

Figure 12D:
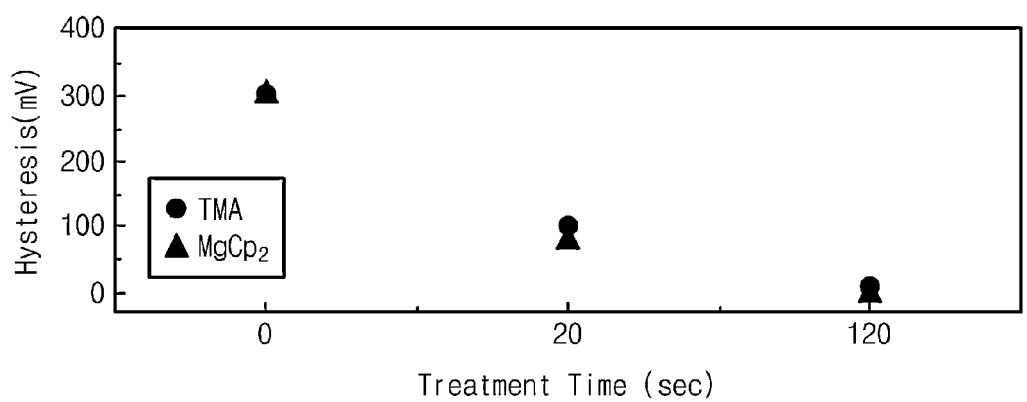
FIG. 12D is a graph illustrating a variation in hysteresis according to the removal of the native oxide from the substrate.

FIG. 12D is a graph illustrating a variation in hysteresis according to the removal of the native oxide from the substrate. As shown, it may be seen that, when the substrate is exposed to the MgCp$_2$ or the TMA, hysteresis may be reduced. In particular, when the substrate is exposed to the MgCp$_2$, relatively low hysteresis may be obtained in comparison that the TMA is exposed to the substrate.

According to an aspect of the present invention, the thermally unstable germanium native oxide may be effectively removed from the germanium substrate.

According to an aspect of the present invention, the semiconductor device having the thin equivalent oxide thickness and high mobility may be manufactured.

According to an aspect of the present invention, the thermally stable germanium device may be manufactured.

The feature of the present invention is not limited to the aforesaid, but other features not described herein will be clearly understood by those skilled in the art from this specification and the accompanying drawings.

The foregoing embodiments are provided to help understanding of the prevent invention, but do not limit the scope of the present invention, and thus those with ordinary skill in the technical field of the present invention pertains will be understood that the present invention can be carried out in other specific forms without changing the technical idea or essential features. Therefore, the technical scope of protection of the present invention will be determined by the technical idea of the scope of the appended claims, and also will be understood as not being limited to the literal description in itself, but reaching the equivalent technical values of the present invention.

What is claimed is:

1. A method of removing native oxide from a substrate, the method comprising:
   exposing the substrate to dicyclopentadienyl magnesium (MgCp$_2$) for a predetermined time.

2. The method of claim 1, further comprising depositing gate oxide on the substrate,
   wherein the exposing the substrate to the MgCp$_2$ is performed before depositing the gate oxide on the substrate.

3. The method of claim 1, wherein the substrate comprises a germanium substrate.

4. The method of claim 3, wherein the exposing the substrate to the MgCp$_2$ comprises exposing the substrate to the MgCp$_2$ to form an oxide layer comprising magnesium and germanium on the substrate,
   wherein, the oxide layer is formed so that a ratio of the sum of binding energy areas of Ge$^{1+}$ and Ge$^{3+}$ to the sum of binding energy areas of Ge$^{2+}$ and Ge$^{4+}$ in a binding energy distribution of the oxide layer ranges from about 1 to about 5.

5. The method of claim 3, wherein the exposing the substrate to the MgCp$_2$ comprises reducing the native oxide comprising at least one selected from GeO and GeO$_2$ from the substrate.

6. The method of claim 1, wherein the exposing the substrate to the MgCp$_2$ is performed in a vacuum state.

7. A method of removing native oxide from a substrate, the method comprising:
   exposing the substrate to trimethyl aluminum (TMA) for a predetermined time,
   wherein the substrate comprises a germanium substrate,
   the exposing the substrate to the TMA comprises exposing the substrate to the TMA to form an oxide layer comprising aluminum and germanium on the substrate, and
   the oxide layer is formed so that a ratio of the sum of binding energy areas of Ge$^{1+}$ and Ge$^{3+}$ to the sum of binding energy areas of Ge$^{2+}$ and Ge$^{4+}$ in a binding energy distribution of the oxide layer ranges from about 0.3 to about 1.

8. A method of manufacturing a semiconductor device comprising:

exposing a substrate to dicyclopentadienyl magnesium (MgCp$_2$) for a predetermined time; and forming a gate insulation layer on the substrate.

9. The method of claim 8, wherein the exposing the substrate to the MgCp$_2$ comprises exposing the substrate to the MgCp$_2$ to form an oxide layer comprising magnesium and germanium on the substrate, the oxide layer being formed so that a ratio of the sum of binding energy areas of Ge$^{1+}$ and Ge$^{3+}$ to a ratio of the sum of binding energy areas of Ge$^{2+}$ and Ge$^{4+}$ in a binding energy distribution of the oxide layer ranges from about 1 to about 5.

10. A method of manufacturing a semiconductor device comprising:

exposing a substrate to trimethyl aluminum (TMA) for a predetermined time; and forming a gate insulation layer on the substrate, wherein the exposing the substrate to the TMA comprises exposing the substrate to the TMA to form an oxide layer comprising aluminum and germanium on the substrate, the oxide layer being formed so that a ratio of the sum of binding energy areas of Ge$^{1+}$ and Ge$^{3+}$ to the sum of binding energy areas of Ge$^{2+}$ and Ge$^{4+}$ in a binding energy distribution of the oxide layer ranges from about 0.3 to about 1.

11. A method of manufacturing a germanium MOS capacitor comprising:

exposing a germanium substrate to trimethyl aluminum (TMA) or dicyclopentadienyl magnesium (MgCp$_2$) for a predetermined time; and depositing a dielectric layer on the germanium substrate.

12. A semiconductor device comprising:

a substrate;

an oxide layer on the substrate, the oxide layer comprising germanium and at least one selected from magnesium and aluminum; and an insulation layer on the oxide layer.

13. The semiconductor device of claim 12, wherein the substrate comprises a germanium substrate.

14. The semiconductor device of claim 13, wherein the oxide layer comprises magnesium and germanium, wherein, a ratio of the sum of binding energy areas of Ge$^{1+}$ and Ge$^{3+}$ to the sum of binding energy areas of Ge$^{2+}$ and Ge$^{4+}$ in a binding energy distribution of the oxide layer ranges from about 1 to about 5.

15. The semiconductor device of claim 13, wherein the oxide layer comprises aluminum and germanium, wherein, a ratio of the sum of binding energy areas of Ge$^{1+}$ and Ge$^{3+}$ to the sum of binding energy areas of Ge$^{2+}$ and Ge$^{4+}$ in a binding energy distribution of the oxide layer ranges from about 0.3 to about 1.

16. The semiconductor device of claim 13, wherein binding energy distribution of the oxide layer has peaks within a binding energy range of about 29.4 eV to about 29.6 eV and a binding energy range of about 30.9 eV to about 31.1 eV.

17. A germanium MOS capacitor comprising:

a germanium layer;

an oxide layer on the germanium layer, the oxide layer comprising aluminum and germanium;

a dielectric layer on the oxide layer; and an electrode on the dielectric layer.

18. The germanium MOS capacitor of claim 17, wherein binding energy distribution of the oxide layer has peaks within a binding energy range of about 29.4 eV to about 29.6 eV and a binding energy range of about 30.9 eV to about 31.1 eV, wherein, a ratio of the sum of binding energy areas of Ge$^{1+}$ and Ge$^{3+}$ to the sum of binding energy areas of Ge$^{2+}$ and Ge$^{4+}$ in the binding energy distribution of the oxide layer ranges from about 0.3 to about 1.

19. A germanium MOS capacitor comprising:

a germanium layer;

an oxide layer on the germanium layer, the oxide layer comprising magnesium and germanium;

a dielectric layer on the oxide layer; and an electrode on the dielectric layer.

20. The germanium MOS capacitor of claim 19, wherein binding energy distribution of the oxide layer has peaks within a binding energy range of about 29.4 eV to about 29.6 eV and a binding energy range of about 30.9 eV to about 31.1 eV, wherein, a ratio of the sum of binding energy areas of Ge$^{1+}$ and Ge$^{3+}$ to the sum of binding energy areas of Ge$^{2+}$ and Ge$^{4+}$ in the binding energy distribution of the oxide layer ranges from about 1 to about 5.

* * * * *